United States Patent [19]

Boling

[11] Patent Number: 5,616,224

[45] Date of Patent: Apr. 1, 1997

[54] APPARATUS FOR REDUCING THE INTENSITY AND FREQUENCY OF ARCS WHICH OCCUR DURING A SPUTTERING PROCESS

[75] Inventor: Norman L. Boling, Santa Rosa, Calif.

[73] Assignee: Deposition Sciences, Inc., Santa Rosa, Calif.

[21] Appl. No.: 437,816

[22] Filed: May 9, 1995

[51] Int. Cl.$^6$ ............................ C23C 14/35; C23C 14/54
[52] U.S. Cl. ........................ 204/298.08; 204/192.12; 204/192.22; 204/192.23; 204/298.19; 204/298.23; 204/298.24
[58] Field of Search ................. 204/192.12, 192.22, 204/192.23, 298.08, 298.19, 298.23, 298.24, 298.26, 298.28

[56] References Cited

U.S. PATENT DOCUMENTS

| | | | |
|---|---|---|---|
| 4,851,095 | 7/1989 | Scobey et al. | 204/192.12 |
| 5,286,360 | 2/1994 | Szczyrbowski et al. | 204/298.08 |
| 5,397,448 | 3/1995 | Gesche et al. | 204/298.16 |
| 5,427,669 | 6/1995 | Drummond | 204/298.08 |
| 5,478,459 | 12/1995 | Latz | 204/298.19 |

*Primary Examiner*—Aaron Weisstuch
*Attorney, Agent, or Firm*—Malcolm B. Wittenberg

[57] ABSTRACT

An apparatus for reducing the intensity and frequency of arcing in a reactive DC sputtering process when the process uses an arc-suppression system which interrupts or reverses the voltage applied to the sputtering target. A plasma having required properties is introduced into the vicinity of the sputtering target by means of a separate plasma applicator which operates independently of the target.

14 Claims, 8 Drawing Sheets

APPARATUS FOR REDUCING THE INTENSITY AND FREQUENCY OF ARCS WHICH OCCUR DURING A SPUTTERING PROCESS

TECHNICAL FIELD OF THE INVENTION

The present invention is an apparatus for reducing the frequency and severity of arcing during a DC reactive sputtering process. When arcing occurs, it severely degrades such a process. Arcs cause material to be ejected from the site of the arc, and some of this material travels to the substrate where it forms defects in the sputtered coating on the substrate surface. Arcs also disrupt the functioning of the sputtering power supply, causing interruptions in sputtering which can result in unacceptable loss of process control and instability of process parameters. Arc suppression is therefore a critical factor that must be considered when designing any sputtering system and arc suppression features are normally incorporated into the target power supply of such a system. This invention enhances the arc suppression performance of prior-art sputtering power supplies which employ voltage interruption or reversal as a means for arc suppression.

BACKGROUND OF THE INVENTION

The importance of incorporating the most effective arc suppression system into a reactive DC sputtering process stems from the fact that the conditions which cause an increase in the rate of formation of a film, increased power and increased flow of reactive gas into the chamber, are the same as those which increase the severity of arcing. Since the presence of arcing severely degrades any sputtering process, there is a maximum rate of film production that can be achieved at a given level of quality using an arc suppression system having a given effectiveness. An improvement in the arc suppression system therefore results in an increased production rate of a process, with resulting economic benefits.

An arc may take the form of an electrical discharge between the target, which is the cathode of the DC power supply, and some surrounding grounded conductor; for example, the conducting shield that is often located around the perimeter of the target. It may also be a so-called "unipolar" arc in which a discharge from the target to the plasma takes place. Once an arc is formed, it dissipates energy stored in the power supply as well as in the plasma.

It is necessary to control both the frequency and the energy of the arcs that appear during a sputtering process. Methods for doing this which are part of the prior art have involved refinements to the sputtering power supply. The present invention further enhances the arc-suppression performance of the power supply refinements, as will be made clear by the following discussion.

Prior art arc suppression systems may be grouped into those which employ some form of power supply interruption, in which the power supply is shut off for a period of time, or voltage reversal, in which the polarity of the power supply voltage (at reduced magnitude) is changed for a period of time. They may be further divided into groups which cause a periodically occurring interruption or reversal of fixed duration, and those which bring about the reversal or interruption only after the beginning of an arc has been detected.

Early sputtering power supplies were non-periodic voltage interruption devices which used an arc sensor built into the power supply. The power supply was designed to shut down for a period of time upon receipt of a signal from the sensor. For power supplies operating with standard line power, the time required for shutdown to occur is a few milliseconds, and the amount of energy dissipated in the arc during shutdown is the order of 5 to 10 Joules for a power supply that delivers between 5 and 10 kilowatts of power to the target, an amount of energy that can cause severe spattering of target material. The dissipated energy has been reduced in other supplies by converting the line frequency to a higher frequency and then using this higher frequency power supply as a source for the DC supply. The time required for shutoff as well as the dissipated energy are inversely proportional to the ratio of the new frequency to the former frequency, so that improvement by a factor of more than 250 can be achieved by changing from 60 Hz to 30 KHz. Power supplies that operate on line frequency are known as line supplies while those which use a higher frequency are called switching supplies.

A simple type of non-periodic voltage reversal system is one that has a built-in "ringing" response to a disturbance in its output. Such a system has reactive components which cause the output, when driven toward zero by the sudden current demand of the arc, to overshoot zero volts and become negative for a period of time long enough to suppress the arc.

The next level of advancement in sputtering power supplies was the introduction of periodic voltage reversals into the power supply output during the sputtering process. During the recurring period of reversal time, the conditions which cause arc formation are suppressed as follows. When sputtering is underway, the target is charged negatively, so that positive ions are attracted to it, causing the desired sputtering. The flow of ions causes positive charge to be deposited not only on conducting portions of the target but also on certain areas of the target that are covered by an insulating layer of sputtered material. Arcs are initiated by electrical breakdown of this insulating layer. During sputtering, as the outer surface of this layer receives a continual bombardment of positive sputtering gas ions, a buildup of positive charge on this surface occurs. This results in a electric field within the layer that increases with time. When the charge density on the surface becomes great enough to cause a field within the insulating layer that exceeds the electrical breakdown strength of the insulating material, a discharge through the layer occurs. The resulting explosive release of material from the discharge site provides a conducting path for a subsequent arc between the target and a nearby conductor or between the target and the plasma.

When a reversed (positive) voltage is applied to the target, the voltage of the outer surface of the insulator becomes positive with respect to ground, causing electrons to flow from the adjacent plasma to the charged surface. This electron flow neutralizes some of the positive charge so that the field within the insulating layer is reduced. If the period of time of charge buildup is kept short enough to prevent breakdown of the insulator during the sputtering part of the cycle, and if conditions are proper during the period of reversal, the arcing can be greatly curtailed.

A straightforward method for achieving voltage reversal is to superimpose upon the target supply a voltage oscillating at a radio frequency (RF) such as 450 KHz, where the peak-to-peak amplitude of the RF signal is sufficient to cause the voltage on the target to be reversed during part of the positive RF cycle. This method has proven to be effective, but it requires the introduction of high levels of RF power which often is not desirable.

A series of controlled voltage reversal systems for arc suppression has been developed especially for DC reactive sputtering by Advanced Energy Systems of Fort Collins, Colo. They are designed to operate with a switching supply and are identified by the trade name SPARC™ or SPARCLE™. These systems, unlike the RF voltage reversal technique do not require that a significant amount of additional power be dissipated in the coating chamber when they are in use.

The SPARC-LE™ systems employ a unit which is inserted between the main power supply and the sputtering target. In an externally triggered mode, in which the systems are non-periodic, a sensor located in the additional unit detects the formation of an arc by monitoring the power supply output. When the arc is detected, the current from the main power supply is switched by the new unit into an inductor which has been preloaded with the same current that the power supply had previously been delivering to the target. There is therefore no change in the current demand on the power supply so that disruptive transients on the power supply output are eliminated. At the same time that the power supply current is switched to the inductor, a small positive voltage in the order of 50 Volts, which is generated by the new unit, is switched onto the target and takes the place of the former negative voltage. The reversal of potential combined with the characteristics that have been designed into the SPARC-LE™ unit cause the arc to be quenched.

In the self-triggered mode, the above described switching process involving voltage reversals at the sputtering target takes place periodically and does not require that the formation of an arc be sensed. In this mode, the system becomes a periodic reversal system whose principle of operation has been discussed previously; however it incorporates additional refinements. The durations of the periods of negative and positive voltages can be varied to meet the requirements of a particular process. Typically, the cathode is biased at its high negative operating voltage for 45 microseconds and at a low positive voltage for 5 microseconds, so that the process repeats every 50 microseconds. The period of time over which the negative voltage is applied is chosen to be short enough to prevent areas of the target which are covered by insulator from acquiring enough charge to cause breakdown. Therefore arcing is averted. During the voltage reversal, the charged areas are discharged by electrons in the plasma surrounding the target. If conditions are sufficiently benign, the discharge is complete and the cycle continues indefinitely with potential arc sites being alternately charged and discharged without acquiring enough charge to cause an arc.

The SPARC-LE™ systems can operate in a self triggered mode and an externally triggered mode simultaneously. During such operation they provide the aforementioned periodic waveform to the sputtering target while monitoring the power supply output to detect the beginning of an arc during the period of negative voltage. If an arc is detected, voltage reversal is instituted and the system behaves as previously described for the externally triggered mode. After the arc is quenched, periodic behavior resumes. By the action described, the SPARC-LE™ system greatly reduces the frequency of arcing in many sputtering processes.

Any voltage interruption or reversal arc suppression system utilizes the principle that when the target voltage is reversed (i.e. made positive) or caused to become zero, the plasma adjacent to the target in the sputtering chamber must deposit a negative charge on each potential arc site, which charge at least partially neutralizes the positive charge that was deposited by the ions left during the previous sputtering period. As the sputtering rate of a particular configuration is increased, the rate of charge deposition is increased, and if the rate of arcing is not to increase, the plasma must provide a correspondingly greater flow of neutralizing electrons. The plasma generated by the sputtering target and its power supply is limited in both the rate at which it can supply electrons and the total number of electrons that it can supply. It is therefore necessary, if the rate of arcing is to be held constant and the sputtering rate is to increase, that a means for increasing the rate of electron delivery and the total supply of electrons be provided.

It is therefore the object of this invention to generate an intense plasma in contact with the sputtering target, the plasma having sufficient density, electron temperature and volume to fully discharge potential arc sites on the target during periods of voltage interruption or reversal provided by the sputtering power supply for the purpose of arc suppression, and by means of the action of this plasma to substantially reduce the frequency and energy of arcing of a reactive sputtering process which employs a given arc-suppression system.

It is a further object of this invention to provide a means for enhancing arc suppression in a reactive sputtering process wherein said means which can be controlled separately from the power supply and thereby to gain increased flexibility in choosing operating conditions for a given process.

SUMMARY OF THE INVENTION

The invention consists of the introduction of at least one device for the purpose of generating a high density, large volume plasma in the vicinity of the target in a DC reactive sputtering system in order to enhance the operation of the arc suppression system of the power supply.

In certain embodiments, a microwave applicator, such as one taken from the class of devices which has been disclosed in U.S. patent application Ser. No. 08/388,191, the disclosure of which is incorporated by reference, any member of which will hereinafter be referred to as a plasmaguide applicator, is placed in the sputtering chamber in such a position that the plasma generated by the applicator diffuses into the vicinity of the sputtering target. If a power supply which uses voltage interruption or reversal for the purpose of arc-suppression, such as the SPARC-LE™, previously described, is employed, the presence of the plasma causes an increase in the current that flows during voltage reversals provided by the power supply. As will be explained later, the increase in reverse current is due to an increase in the average electron density and uniformity in the plasma. The higher current causes a more complete discharge of potential arc sites so that the current increase is beneficial to the arc-suppression process. The increase in reverse current is, in fact, observed to be accompanied by a decrease in the frequency of arcing at a given level of DC power delivered to the target. Inasmuch as the deposition rate increases with the DC power delivered to the target, incorporation of the applicator causes an increase in deposition rate for a constant rate of arcing. The direct consequence is a that this invention allows a higher production rate to be achieved by the process.

DETAILED DESCRIPTION OF THE INVENTION

Figure 1:
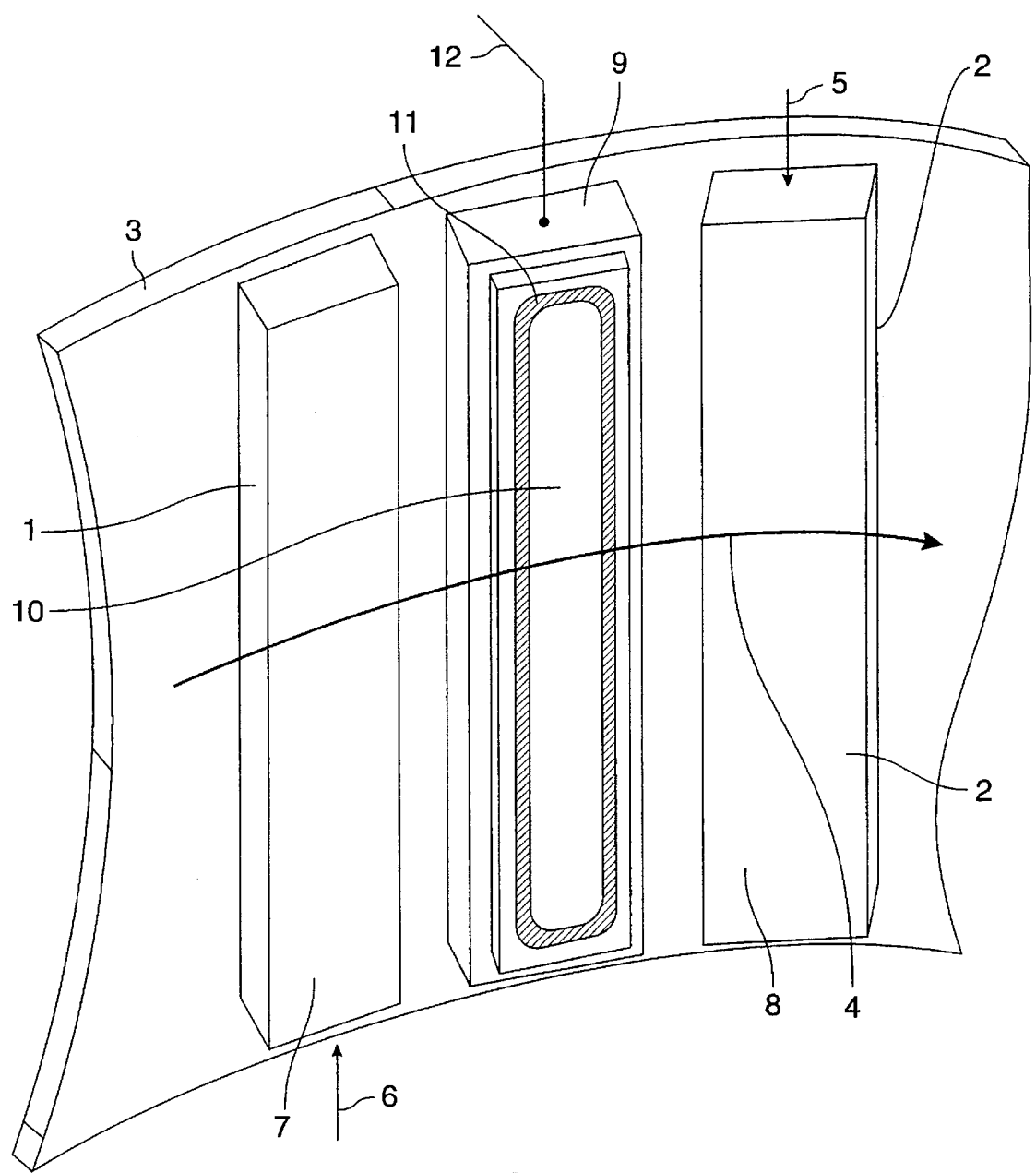
FIG. 1 is a perspective of an embodiment of the invention showing microwave applicators and a sputtering target mounted on the walls of a sputtering chamber.

FIG. 1 is a view of an embodiment of the invention in which at least one microwave applicator is mounted on a portion of the wall 3 of a vacuum chamber. Two applicators 1, 2 are shown in FIG. 1. The applicators may be of any type; for example, they may be taken from the class of devices called plasmaguides that has just been cited. For the geometrical arrangement in FIG. 1 the applicators are elongated and have their long axes parallel to the axis of the sputtering target 10. The substrates, not shown, are transported by a transporting device such as a drum, belt or web in a direction in or opposite to the direction indicated by the arrow 4. The motion is transverse to the long axis of the applicators and target and causes the substrates to pass in front of them. Energizing power, shown schematically entering the applicators by arrows 5, 6 under proper low pressure conditions within the chamber, causes a plasma to be ignited in the vicinity of the surface, 7, 8 of each applicator, which surface faces into the chamber. The plasma, which extends over the entire length of each applicator, diffuses into the nearby space.

A target assembly consisting of an outer case 9 which encloses a target 10 and an assembly of permanent magnets, not shown, is also mounted to the grounded chamber wall. The target is an elongated plate comprised of the material to be sputtered, for example, silicon or titanium. The configuration of the magnets in the target assembly is such as to cause a process known as magnetron sputtering to occur in the region of the target indicated by the racetrack-shaped groove 11. Such a target configuration is widely used in the prior art of reactive sputtering.

The output lead 12 of the sputtering power supply, not shown, which employs voltage interruption or reversal for the purpose of arc suppression, is connected to the target. When the power supply in energized causing the sputtering voltage to be applied to the target, a plasma is generated in the region around the target and ion current flows to the target. The plasma diffuses into nearby regions within the chamber.

Plasma from the two applicators 1, 2 diffuses into the region of the target where it commingles with plasma generated by the DC power supply. The additional plasma from the applicators causes an increase in electron density and temperature over the values that they would have if the applicators were not present. As will be explained in the discussion of FIG. 3, this plasma facilitates the discharge of potential arc sites on the target, thereby increasing the rate of sputtering that can be achieved without appreciable arcing.

Figure 2:
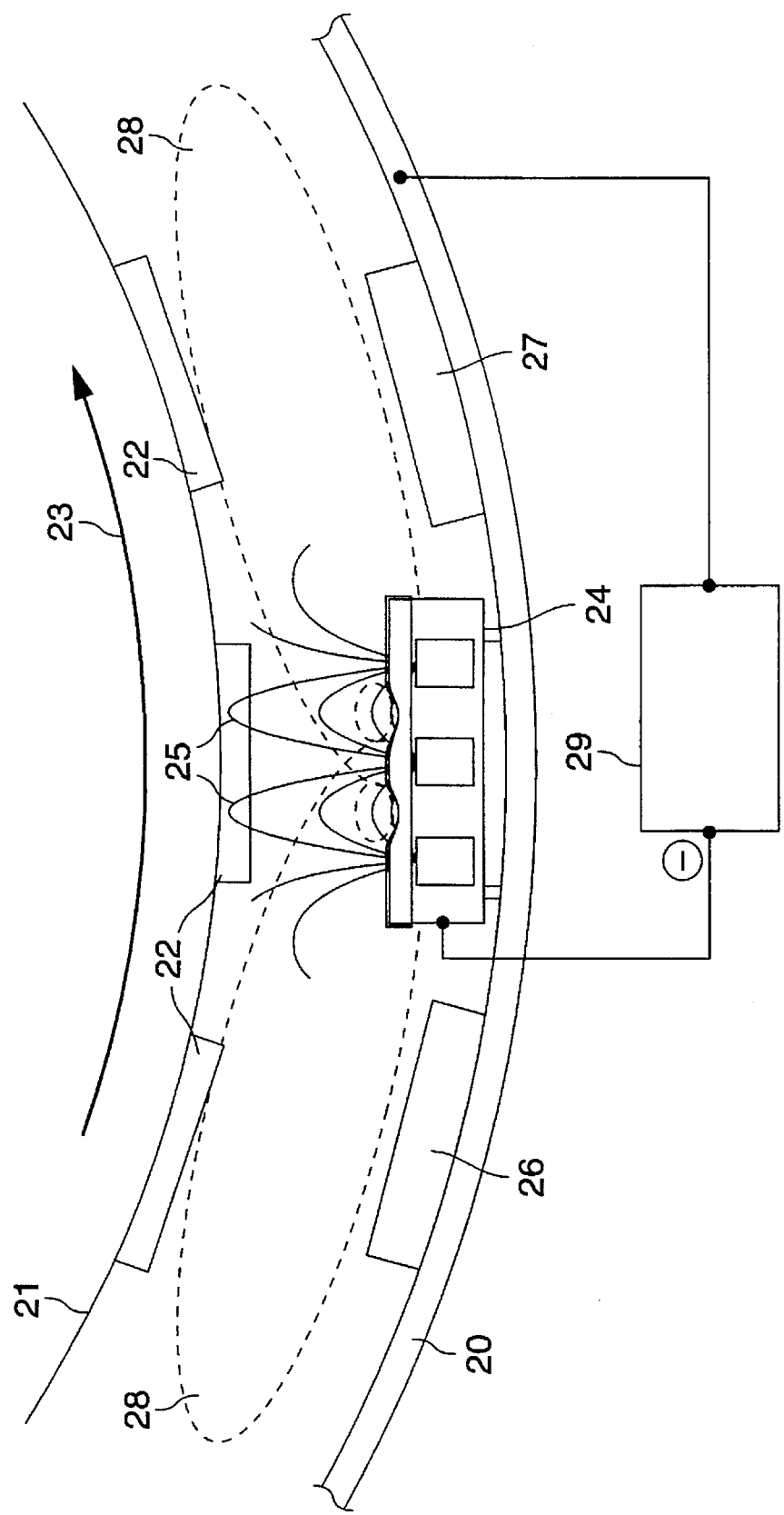
FIG. 2 is a section of an embodiment of the invention as practiced using a plasmaguide applicator in a batch process in which substrates are conveyed by a rotating drum.

FIG. 2 shows an embodiment of the invention that uses an applicator taken from the class of applicators called plasmaguides. Plasmaguides use microwave power to generate and sustain a plasma. The plasma is most intense along a surface of the plasmaguide that is penetrable by microwaves. This surface may have a wide variety of shapes and may have an area comprising several thousand square centimeters. The plasmaguide type; of applicator has been used to couple power into a plasma at a level of more than 25 watts per square centimeter, so that coupling of 100 kilowatts of power into a plasma over a surface having an area of 4000 square centimeters is possible when a plasmaguide is employed in the practice of the present invention. As will be shown later, employing an applicator which has the ability to couple large amounts of power into the adjacent plasma is essential to the practice of this invention in many industrial applications.

FIG. 2 depicts a section through an embodiment of the invention as used in a coating machine which employs a rotating drum for conveying the substrates within a sputtering chamber 20. The rotating drum 21 conveys substrates 22 in the direction of the arrow 23 so that they pass over at least one plasmaguide applicator and a sputtering target assembly 24 with associated lines of magnetic force 25. Two applicators 26, 27 are shown in FIG. 2. The applicators and target have an elongated form with the axis of elongation oriented perpendicular to the plane of the Figure. A power supply 29 having voltage interruption or reversal capability is connected between the target and ground. The terminal which supplies the sputtering power is marked by an encircled minus sign.

If the applicators were not present, a plasma would form in the region between the target and the drum when the sputtering voltage is applied to the target. As will be explained in the discussion of FIG. 3, this plasma, not shown, would be non-uniform and limited in spatial extent. When microwave power is applied to the applicators, a plasma whose intensity can be controlled by varying the level of microwave power that is applied to the applicators is ignited in the shaded regions 28. These regions extend into the volume of the chamber on both sides of each applicator, commingling with the plasma generated by the power supply, and, as will now be shown, cause the discharge of potential arc sites on the target during the period of voltage reversal of the power supply.

Figure 3:
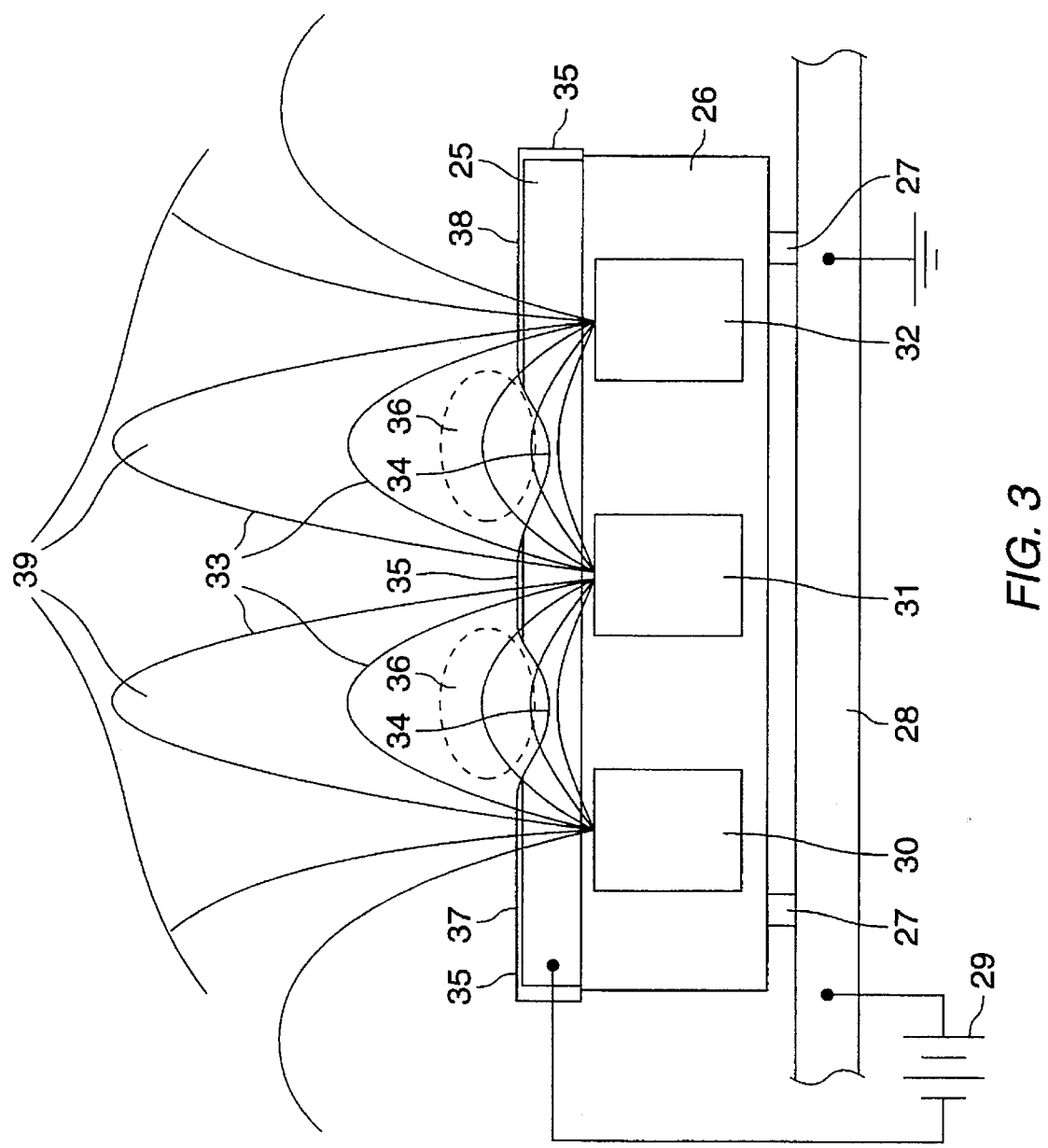
FIG. 3 is a cross section of the target in a DC reactive sputtering process, illustrating the principle of operation of the invention.

The invention functions by providing a source of plasma in the vicinity of the target, which source is driven independently from the DC power supply and can serve as a source of current for discharging potential sites of arcing on the substrate. To understand its function, refer to FIG. 3 and FIG. 4. FIG. 3 is a cross section through a target assembly made perpendicular to its long axis. The assembly comprises a target 25, made of material to be sputtered, a metal supporting structure 26, and an elongated magnet assembly shown in cross section by the three magnets 30, 31, and 32. The assembly is mounted to the chamber wall 28 on insulating standoffs 27 which electrically isolate it from the wall. The cathode of a DC supply 29 is connected to the target and the anode is connected to the grounded chamber wall. The magnet assembly produces a magnetic field indicated by the field lines 33 which are parallel to the surface of the target at a point midway between the magnets but are nearly perpendicular to the target surface at a point directly over the magnets.

Figure 4:
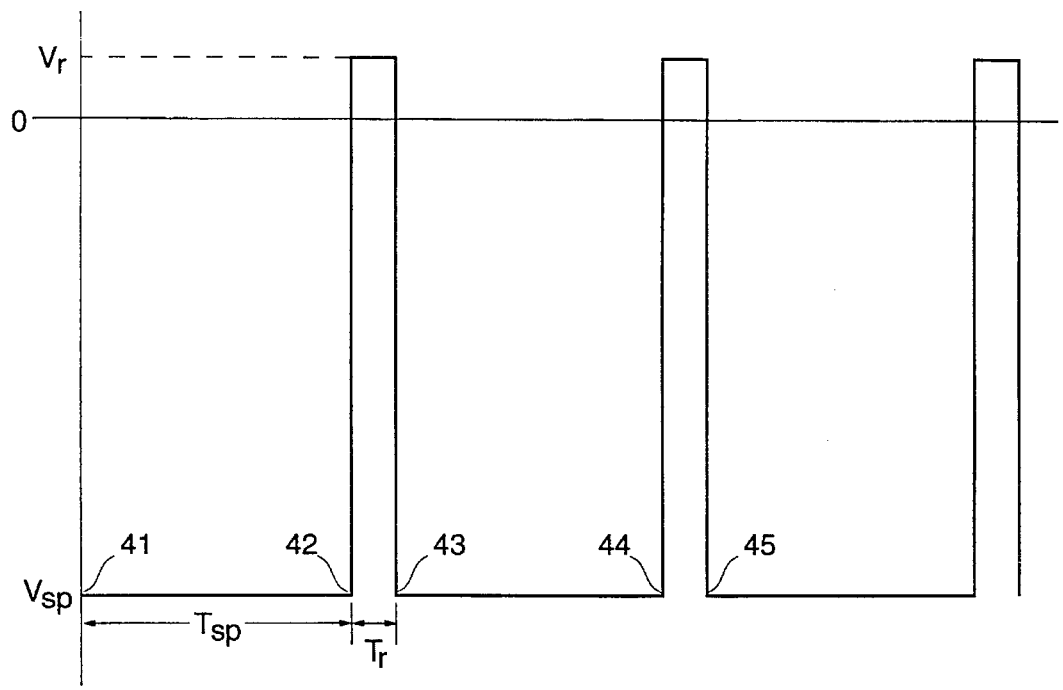
FIG. 4 is an idealized waveform showing the time variation of the, output of a controlled periodic voltage reversal system.

FIG. 4 is a depiction of an idealized voltage waveform that is produced by such a power supply when it is operating in a periodic mode. The power supply voltage is plotted as the ordinate and elapsed time is the abscissa. At the start of a voltage cycle, indicated by the point at time 41, the voltage is $V_{sp}$, where $V_{sp}$ is the voltage (nominally −500 volts) that is applied during the sputtering portion of the cycle. After a certain time interval, $T_{sp}$, the point 42 in FIG. 4 is reached, at which time the power supply voltage reverses and switches to a voltage $V_r$, (nominally +50 volts) remaining at this value for a time period $T_r$. At the end of $T_r$, point 43 is reached for which conditions are the same as occurred at point 41. The next cycle begins at point 43, point 44 corresponding to point 42, and point 45 to 43. The cycles repeat for the duration of the sputtering process.

Reference is made to both FIG. 3 and FIG. 4 in consideration of the mechanism of arc-suppression as practiced by prior art. At the time indicated by point 41, when the supply voltage is switched onto the target, a plasma is ignited in the region of FIG. 3 which is above the target. The potential of the plasma is close to that of the chamber walls, and a drop in potential that is equal to $V_s$ occurs across a region next to the target which is known as the sheath. Since this region is at most a few millimeters thick, there is a strong electric field within it. The electric field interacts with the magnetic field in the regions of the racetrack 34, producing the desired magnetron action with the generation of an intense plasma in the regions 36 above the racetrack and consequent rapid sputtering of material away from the racetrack by impinging ions of sputtering gas. Sputtered material travels to all nearby surfaces where it is deposited and subsequently reacts with the reactant gas in the chamber to form an insulating layer 35 on the target and on other surfaces. Only the insulating material 35 on the target is shown in FIG. 3.

While sputtering occurs only in the region above the racetrack where the electric and magnetic fields are mutually perpendicular, ions of sputtering gas are accelerated across the sheath and strike the entire surface of the target including those areas that are covered by insulator. As previously indicated, the ion current causes a buildup of charge on the surface of the insulator with a resulting electric field within the insulator. In order to prevent arcing, it is necessary that the arc-suppression system provide a means for discharging the insulator surface prior to the time at which the electric field exceeds the breakdown strength of the insulating material.

After the sputtering portion of the cycle, at the time represented by point 42, the voltage reversal period begins during which the discharge of the insulating layer is supposed to occur. At this time, the power supply voltage switches to $V_r$. Since $V_r$ is insufficient to maintain the plasma, the plasma immediately begins to dissipate. At the same time, the outer surface of the insulator is raised to a value that is higher than $V_r$, due to the charge that it acquired during the period $T_{sp}$. This causes an electron current to flow through the plasma to the insulator, partially discharging it.

The discharge of the voltage on the insulator by the electron flow is limited for the following reasons. The plasma, which is concentrated in the regions 36 above the target ceases to be sustained by the power supply at the instant of voltage reversal. Therefore the amount of electron charge that is available is limited to that already contained in the plasma at the time, of voltage reversal. In actuality, only a portion of this charge reaches the insulator surface.

A second factor which hinders discharge is that the spatial distribution of electrons in the plasma is highly non-uniform, being high in the regions 36 above the racetrack and decreasing rapidly with distance from these regions. It is well known that the direction of motion of electrons in the magnetic field within the plasma, either by diffusion or by drift in the electric field is substantially restricted to that of the magnetic field lines. This implies that electrons which can reach a point on the target must lie close to a magnetic field line which passes through that point. Referring to FIG. 3, it is apparent that the magnetic field lines which pass through points indicated by 35, 37 and 38 do not pass through regions of high plasma density and therefore these points will receive less electron charge during the reversal cycle than points that lie closer to the racetrack 34. It may therefore be inferred that prior-art arc suppression systems do not provide complete and uniform discharge of the oxide layer on the target.

The present invention provides a uniform plasma of high density in the entire region 39 (FIG. 3) above the target. This plasma is provided by applicators operating at a power level that is independent of time so that the characteristics of the plasma that it generates remain constant through the entire cycle of FIG. 4. In particular, the plasma does not begin to dissipate at the time of voltage reversal, and thus remains a constant and rich source of electrons during the entire reversal period. Since the plasma acts as a constant source of electrons, it greatly supplements the supply of electrons available in prior-art sputtering.

The plasma that is supplied by the applicator is generated over a wide area and fills the entire region 39 above the target. The spatial distribution of the plasma is therefore altered by the presence of the applicator so that the plasma density no longer decreases with distance from the regions 36. By inspection of FIG. 3, it is apparent that magnetic field lines passing through points at locations indicated by 35, 37, and 38 on the insulator pass through the region 39 which is filled with the high density plasma of the present invention and therefore receive discharge electrons which travel along these lines. This is in contrast to prior-art arc suppression in which electrons were not spatially distributed in such a way as to reach these points.

Figure 6:
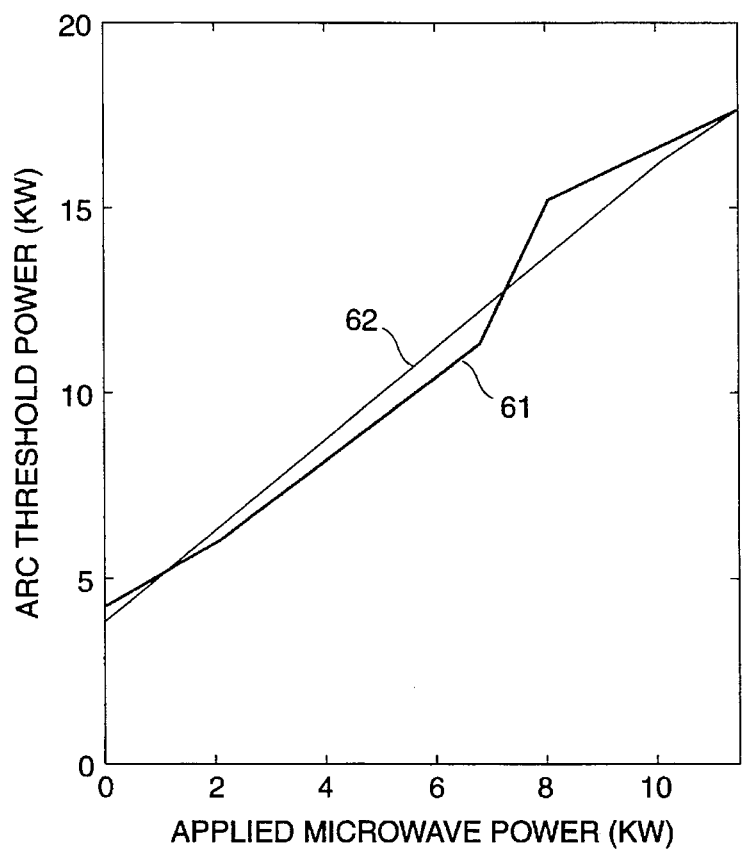
FIG. 6 is a graph showing the measured increase of arc threshold power which has been achieved by the practice of the present invention.
Figure 5A:
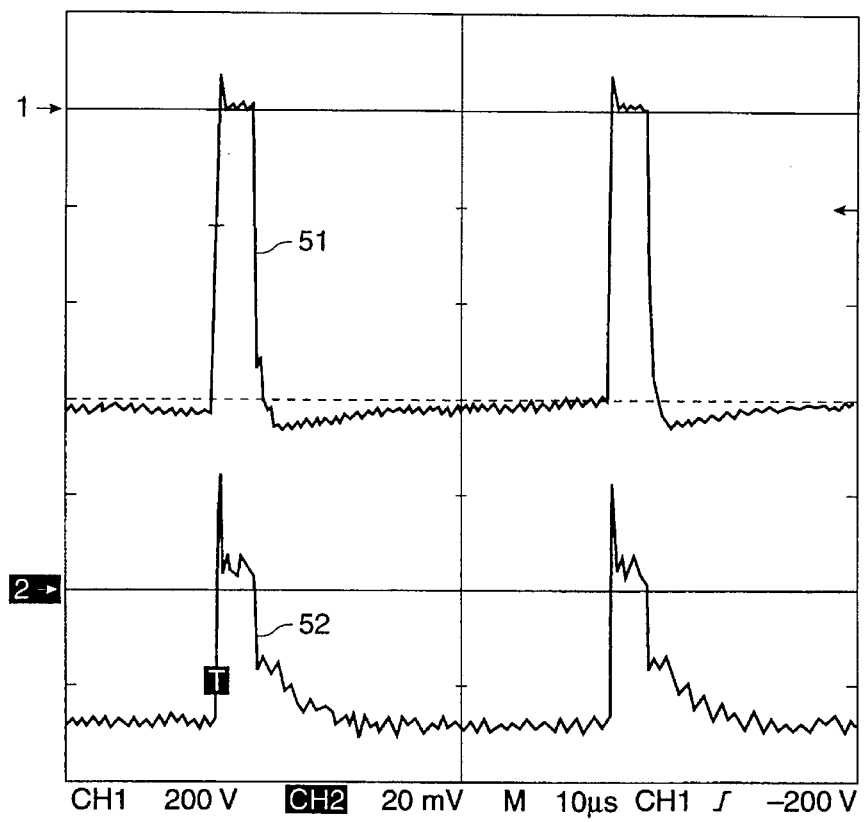
FIG. 5a is a strip chart showing the actual voltage and current waveforms of the SPARC-LE™ system during a sputtering operation in a drum coater.
Figure 5B:
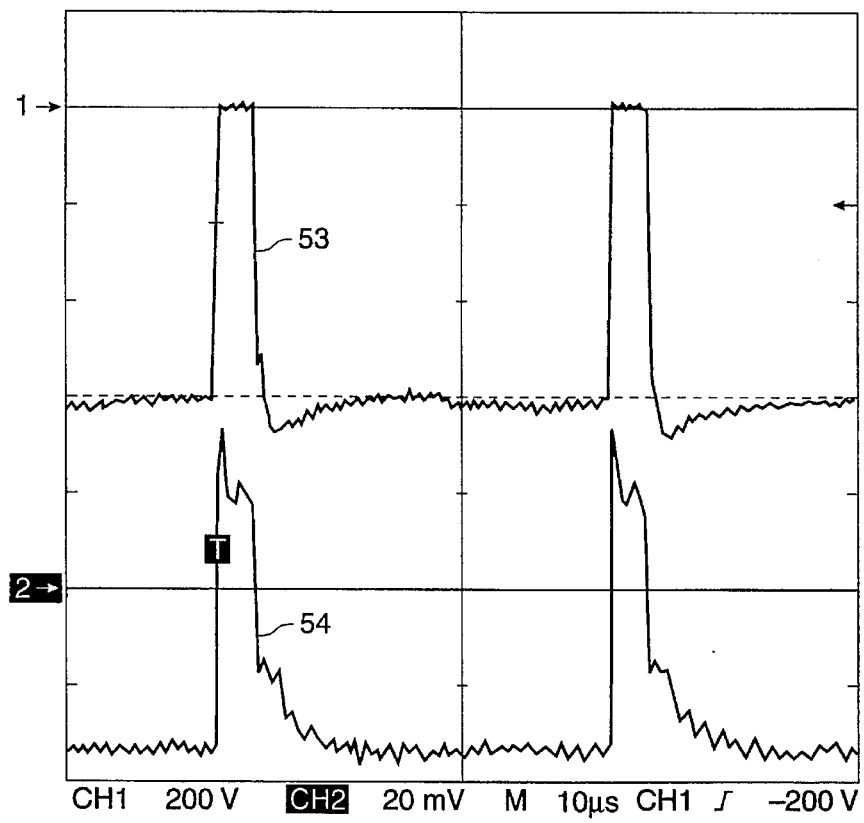
FIG. 5b is a strip chart showing the actual voltage and current waveforms of the SPARC-LE™ system during the same sputtering operation after an auxiliary plasma had been introduced into the vicinity of the sputtering target by the practice of the present invention.

The data given in FIGS. 5a, 5b, and 6 validate the theory of operation of the present invention and provide a measure of the increase in sputtering rate that it provides. FIGS. 5a and 5b are voltage and current waveforms at the target in a coating machine as recorded by a high speed digital oscilloscope during a sputtering run in which a SPARC-LE™ arc suppression system was employed. The traces 51 and 53 in FIGS. 5a and 5b are voltage waveforms with a vertical scale of approximately 200 volts per major division and a horizontal time scale of 10 microseconds per major division. The traces 52 and 54 are current waveforms plotted on the same time axis with a vertical scale of 20 amperes per major division. Zero volts for traces 51 and 53 is marked by the numeral "1" with an arrow and zero amperes for traces 52 and 54 is marked by the numeral "2" with an arrow. The sputtering machine incorporated a rotating drum and had a configuration like that depicted in FIG. 1. The radius of the drum was 15 inches, and the 15 inch-long target was mounted on the wall of the drum at a distance of 3 inches from the drum surface. Elongated plasma guide applicators were mounted on either side of the target as in FIG. 2 with 12 inch spacing between the long axes of the guides and the target. FIG. 5a shows data taken when no microwave power was being applied to the applicators. FIG. 5b shows data taken when 5 kilowatts of microwave power was being applied, the power supply voltage settings being the same as in FIG. 5a.

Examining the voltage waveforms in FIGS. 5a and 5b, one sees equal time periods of roughly 45 microseconds duration when the target voltage was approximately −600 volts and sputtering occurred. These were interspersed with equal periods of approximately 5 microseconds duration in which the voltage was slightly positive and the insulating layer was discharged. The voltage waveforms with and without microwave power were very similar during the sputtering period; however, during the discharge period, the "reversed" voltage assumed a lower positive voltage when the microwave power was turned on.

The current waveforms for the microwave-on and microwave-off cases had a similar shape during the sputtering period, but the magnitude of the sputtering current was higher when the microwave power was on. During the discharge period, the target current was approximately four times higher when the microwave power was turned on than when it was off. The current drain on the supply of reversed voltage was the cause of the lower positive voltage during the discharge period when the microwave power was on. The current increase was evidently caused by the presence of the enriched plasma that was generated by the additional applicators. Some of the additional current represented electron flow to the potential arc sites and their consequent discharge which would be expected to result in a decrease in arcing susceptibility for that machine.

The sputtering power is defined to be the power that is delivered to the target by the power supply during the sputtering part of the cycle. For a sputtering process that is run under a particular set of conditions, there is a maximum level of sputtering at which the process can be run without unacceptable arcing which is called the arc-threshold power. Since the rate of deposition of material on the substrate is proportional to the sputtering power, the arc-threshold power defines the maximum sputtering rate that can be achieved. Based on the data shown in FIGS. 5a and 5b, which suggested that a more complete and uniform discharge of the arc sites on the target occurred when microwave power was being applied to the applicator, it would be expected that the application of microwave power would also increase the arc-threshold power and, consequently, the production rate of the process.

This is borne out by the data presented in FIG. 6. This shows the measured dependence of the arc-threshold power on microwave power at 2.45 GHz applied to a plasmaguide applicator in a particular sputtering process. The process used a SPARC-LE™ arc-suppression system in conjunction with a single elongated microwave applicator which was located adjacent to and axially aligned with a 35 inch long sputtering target. To acquire the data, a fixed level of microwave power was applied to the applicator and the target voltage was raised to a level at which arcing began to occur. The arc-threshold power for that level of applied microwave power was taken as the product of target voltage by the target current when arcing was initiated. This procedure was repeated for a number of applied microwave power levels from 0 kilowatts 11.6 kilowatts.

In FIG. 6, the arc-threshold power in kilowatts was plotted on the vertical axis against the applied microwave power in kilowatts on the horizontal axis. The Figure shows that the arc-threshold power increased from 4.2 kilowatts with the microwave supply off to 15.2 kilowatts when the maximum microwave power of 11.6 kilowatts was applied. Line 61 in FIG. 6 connects the actual data points, while line 62 is a best linear fit to the data. Inspection of the figure indicates that the dependency of arc-threshold power on applied microwave power was roughly linear with a change in the ratio of nearly four to one in the range over which the microwave power could be varied. The slope of the best linear fit, line 62, was determined to be 1.25 kilowatts of arc-threshold power increase for each kilowatt of microwave power increase. Since the maximum achievable deposition rate is directly proportional to the arc-threshold power, the data of FIG. 6 show that the production rate of the process studied in preparing FIG. 6 is increased by a factor of nearly four by the present invention.

The magnitude of the increase in coating production rate that can be achieved by the practice of this invention compared to that which can be achieved by prior art is therefore substantial. The increase is particularly beneficial when used with large industrial in-line or roll coating processes such as will be described later in conjunction with FIGS. 8 and 9. From FIG. 6, it is apparent that the level of microwave power that was required to achieve a given gain in sputtering rate was about 1 kilowatt of applied microwave power for each 30% rate increase, calculated with reference to the rate when no microwave power was applied. This implies that for high gain in sputtering rate, a microwave power comparable to the arc threshold power is required. For the process of FIG. 6 the highest microwave power was 11.2 kilowatts.

Figure 7:
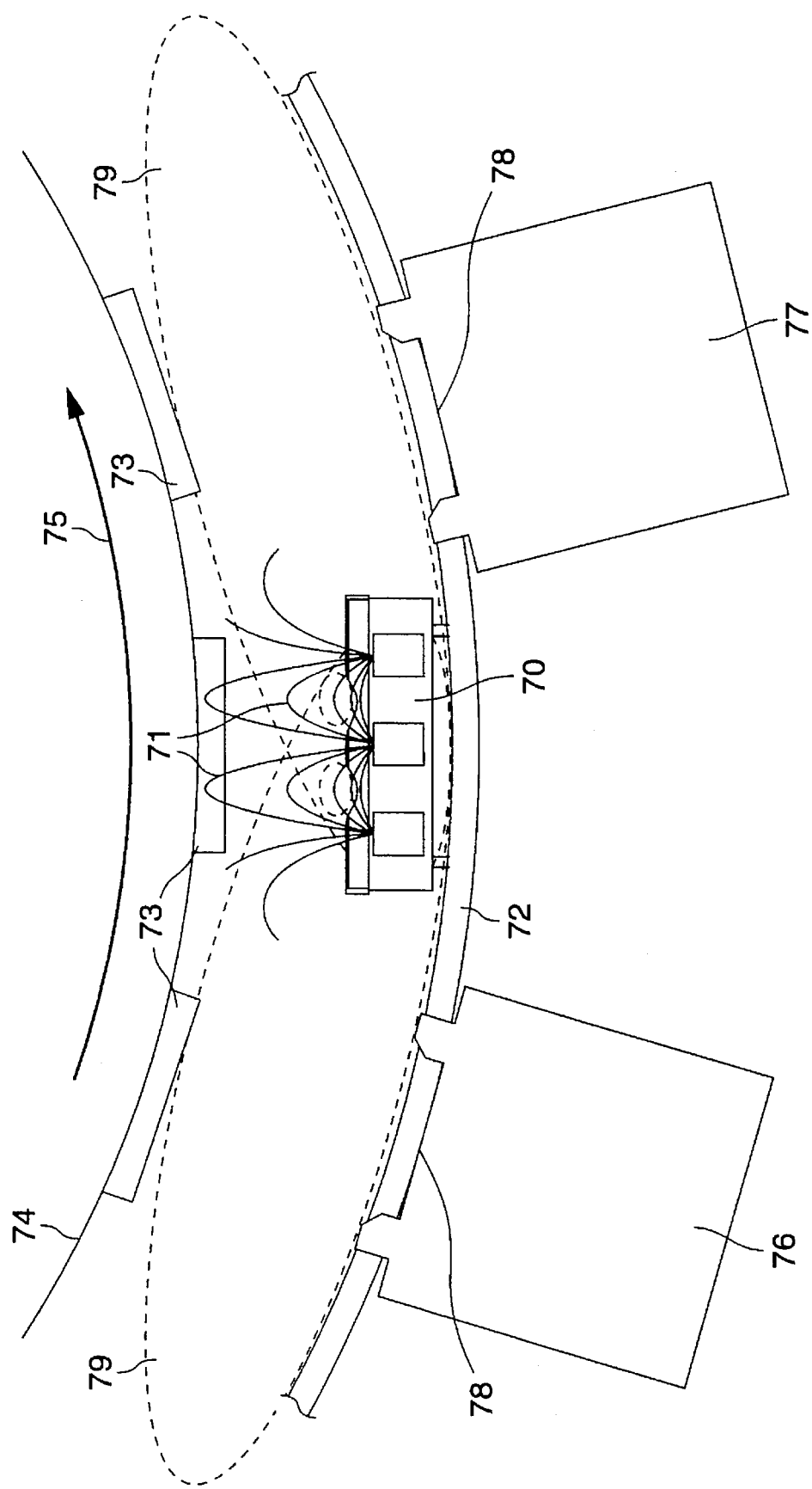
FIG. 7 is a section of an embodiment of the invention as practiced using a traveling wave applicator in a batch process in which substrates are conveyed by a rotating drum.
Figure 8:
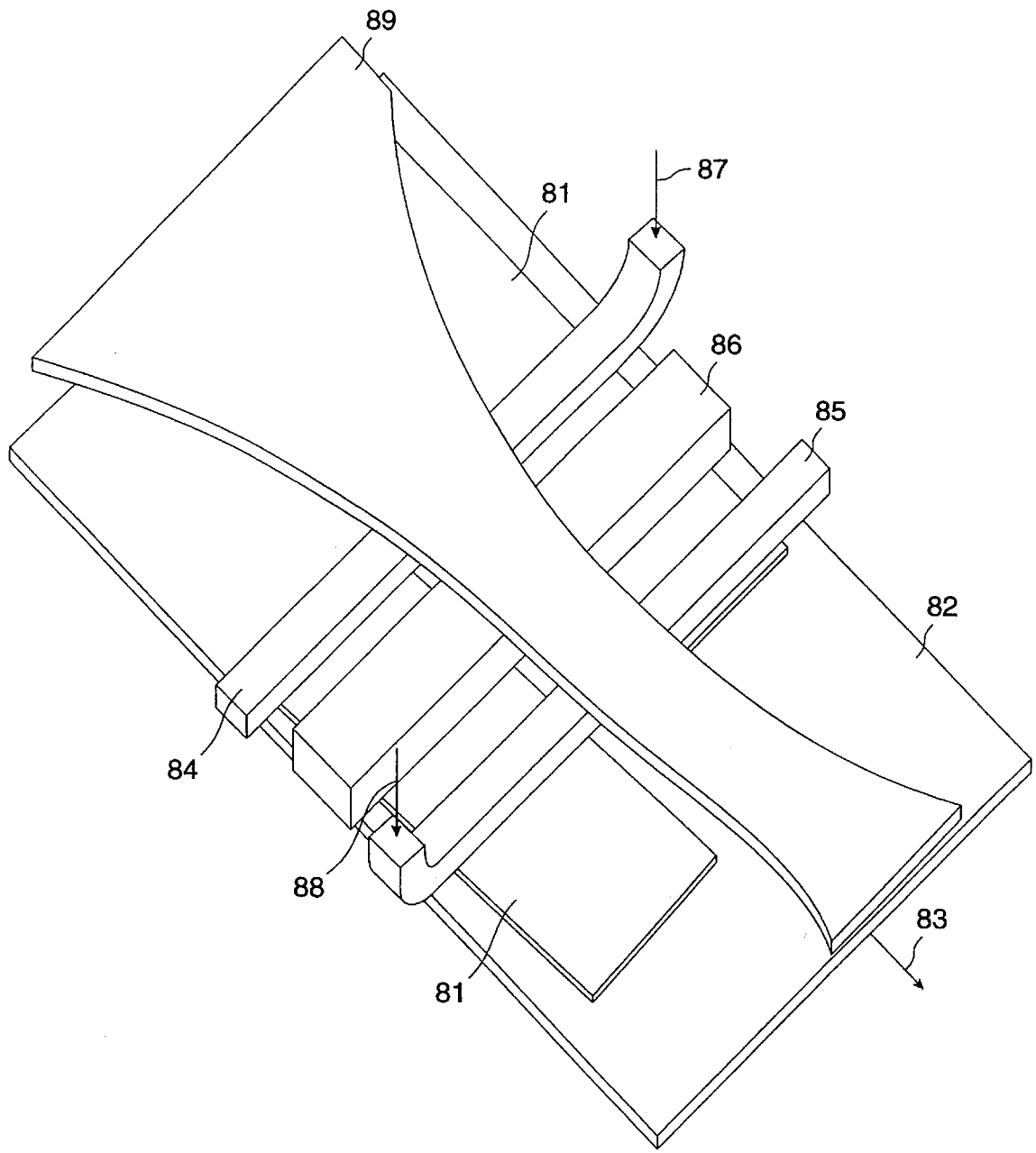
FIG. 8 shows an embodiment in which the invention is used to increase the production rate of an in-line film deposition process.
Figure 9:
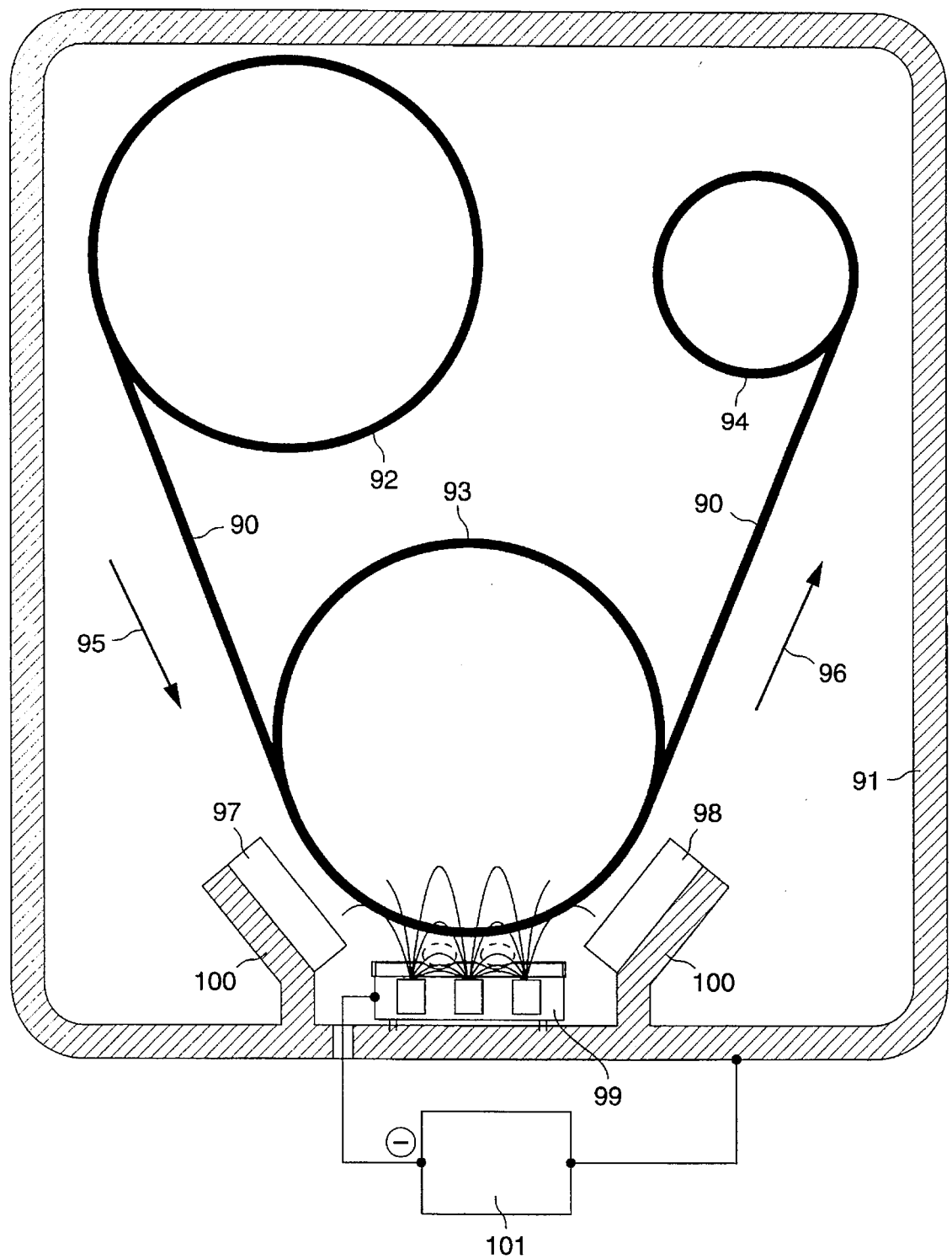
FIG. 9 shows an embodiment in which the invention is used to increase the production rate of a roll coating process.

The embodiments of FIGS. 2, 8, and 9 use at least one plasmaguide applicator. As previously indicated, this type of applicator can be designed to couple very high levels of power to the plasma. Other types of applicator which are capable of delivering high power levels are also applicable, such as the applicator used in the embodiment of FIG. 7.

The invention consists of the use of any type of applicator in conjunction with a sputtering supply which employs voltage interruption or reversal in order to reduce the energy or frequency of arcing. FIG. 7 shows an embodiment in which the applicator is based on an invention by Kieser disclosed in U.S. Pat. No. 4,630,568, the disclosure of which is hereby incorporated by reference. In FIG. 7 the same drum coater configuration that was shown in FIG. 2 is illustrated, including a sputtering target assembly 70 with magnetic field lines 71, a portion of the chamber wall 72, and substrates 73 being transported by a rotating drum 74 in the direction of the arrow 75. The microwave applicators 76 and 77, shown only in outline, are different from those of FIG. 2 in that they employ the traveling wave applicator as taught by Kieser. This type of applicator contains within it an elongated traveling wave structure and hence will be called a traveling wave applicator. The traveling wave structure, not shown, has its longitudinal axis situated so as to be perpendicular to the plane of the figure. An elongated window which is penetrable by microwaves and is part of the applicator has its outer surface 78 parallel to the long axis of the traveling wave structure and also to the motion of the substrates at a point above the center of the surface. When this structure is driven by microwaves, a strong, oscillating electromagnetic field generated by the applicator extends through the windows into the regions of the chamber which lie between the surfaces of the window and the substrates. In these regions the strong field creates intense plasmas 79 which diffuse outward into the surrounding regions of the chamber. As in the embodiment of FIG. 2, the plasma commingles with the plasma generated by the sputtering target, causing the combined plasmas to fill the shaded regions 79 as well as the unshaded volume between the target assembly and the drum, thereby providing an enduring and spatially uniform source of electrons for the discharge of potential arc sites.

FIG. 8 shows an embodiment of the invention used in conjunction with an in-line reactive sputtering process. Large substrates 81, such as plates of window glass, move at a constant velocity on a conveying mechanism 82 in the direction of the arrow 83 so as to pass into the proximity of at least one microwave applicator. Two plasmaguide applicators 84 and 85 are shown in FIG. 8. A target assembly 86 proximate to the applicators is situated in such a way that sputtered material from the target is deposited uniformly on the large substrates. When microwave power traveling in the direction of the arrows, 87, 88, enters the applicators, plasma is generated along the lower surfaces of the applicators and diffuses into the surrounding space so that the target is bathed in plasma generated by the applicators.

A DC power supply, not shown, employing voltage interruption or reversal for the purpose of arc suppression, is connected between the target and the chamber walls, which have been cut away so that only a portion 89 of the top wall is visible. Plasma generated by the applicators assists in the discharge of potential arc sites in the vicinity of the target, significantly decreasing the frequency of arcs at a given rate of deposition on the substrate. Thus the required quality and thickness of deposited film can be maintained for a higher transport velocity of the substrate, and the rate of production achieved by the process is increased to a level that is greater that could be achieved without the incorporation of this invention.

It is possible to use the data of FIG. 6 to estimate the maximum levels of power that could be delivered to the target without arcing in an in line process, such as the embodiment of FIG. 8. In such a process, a target when operated according to prior art, typically dissipates 75 kilowatts of power. It is reasonable to assume that the FIG. 6 data can be scaled up to reflect the in-line process and that 75 kilowatts corresponds to the point in FIG. 6 where the applied microwave power was 0 kilowatts. Based on this assumption, the same target could be operated without arcing at a power level which is considerably greater than 75 kilowatts with a commensurate increase in sputtering rate. The maximum attainable power might then be set by some constraint other than arcing, such as the ability to cool the target.

The plasmaguide applicators have been used to deliver power of the magnitude that is required at the high power levels that are typical of industrial in-line coaters and consequently, as indicated by the data of FIG, 6, are capable of increasing the sputtering rate by a factor of as much as four, if constraints other than arcing do not set a lower limit.

FIG. 9 schematically illustrates how the invention is practiced in order to augment a process in which the substrate 90 takes the form of a continuous flexible sheet which is stored on spools. In FIG. 9 the coating chamber 91 contains a storage spool 92, a guide roller 93 and a take-up spool 94. During the process, the substrate moves from the storage spool 92, around the guide roller to the take-up spool in the direction of the arrows 95 and 96. As in other embodiments, at least one applicator is placed in the proximity of the target assembly. In FIG. 9, two plasmaguide applicators 97, 98 placed on either side of the target assembly 99 with their long axes parallel and oriented transverse to the motion are shown in cross section. The applicators are electrically and mechanically integral with the grounded supporting structure 100. Coating of the substrate takes place as is passes around the bottom of the guide roller and over the sputtering target.

A sputtering power supply 101 which employs voltage interruption or reversal as a means for arc suppression is shown connected between ground and the sputtering target.

As in FIG. 2, the terminal which supplies the sputtering voltage is designated by an encircled minus sign. When the sputtering voltage is applied to the target and microwave power is applied to the applicators, the plasmas generated by the target commingle so as to fill an extended volume that occupies the space above and adjacent to the target. As in the case of other embodiments, this plasma facilitates the discharge or potential arc sites, so that incorporation of the invention into the process results in a significant increase in the rate of production for the same quality of coated substrate over that which could be achieved with prior art.

We claim:

1. A sputter coating system comprising a vacuum chamber, a means within said chamber adapted for mounting substrates, at least one magnetron sputtering device positioned at a work station adjacent to the means for mounting substrates and adapted for developing a first plasma for sputtering at least a selected material onto said substrates, said magnetron sputter device being operatively connected to a DC power supply which employs a voltage interruption or reversal feature in order to reduce energy or frequency of arcing between said target and said chamber or first plasma and at least a second device positioned in the vicinity of said magnetron sputter device for the purpose of generating a second plasma which commingles with said first plasma acting as a source of current for discharging potential sites of arcing and bringing about further suppression of said arcing.

2. The sputter coating system of claim 1 wherein said second device is powered by a power supply which operates independently of the DC power supply of said magnetron sputter device.

3. The sputter coating system of claim 1 wherein said second device comprises an applicator connected to a microwave power supply.

4. The sputter coating system of claim 1 wherein a reactive gas is introduced into the chamber for conversion of said selected material to a different chemical species and wherein arcing occurs across said different chemical species.

5. The sputter coating system of claim 4 wherein said different chemical species is more electrically insulating than said selected material.

6. The sputter coating system of claim 4 wherein said sputtered material is silicon, said reactive gas is oxygen and said different chemical species is silicon dioxide.

7. The sputter coating system of claim 4 wherein said sputtered material is aluminum, said reactive gas is oxygen and said different chemical species is aluminum oxide.

8. The sputter coating system of claim 1 wherein said at least one second device comprises at least one applicator connected to a microwave power supply.

9. The sputter coating system of claim 1 wherein said substrates are mounted on a drum.

10. The sputter coating system of claim 1 wherein said substrates are mounted on a transporting means for conveying them substantially in a straight line past the sputtering target.

11. The sputter coating system of claim 1 wherein said substrate takes the form of a long continuous strip of material that can be stored on a spool.

12. The sputter coating system of claim 1 wherein said further suppression of said arcing enables an increase in the rate of production of said sputter coating system.

13. The sputter coating system of claim 1 wherein said further suppression of said arcing enables an improvement of the process stability of said sputter coating system.

14. The sputter coating system of claim 1 wherein said at least one magnetron sputtering device creates a coating in the form of a film of said selected material on said substrates and wherein said suppression of said arcing results in an increase in the quality of said film so produced.

* * * * *